(12) United States Patent
Hattori

(10) Patent No.: US 7,633,738 B2
(45) Date of Patent: Dec. 15, 2009

(54) ELECTROSTATIC CHUCK AND MANUFACTURING METHOD THEREOF

(75) Inventor: Akiyoshi Hattori, Nagoya (JP)

(73) Assignee: NGK Insulators, Ltd., Nagoya-Shi (JP)

( * ) Notice: Subject to any disclaimer, the term of this patent is extended or adjusted under 35 U.S.C. 154(b) by 4 days.

(21) Appl. No.: 11/980,007

(22) Filed: Oct. 30, 2007

(65) Prior Publication Data

US 2008/0100985 A1    May 1, 2008

(30) Foreign Application Priority Data

Nov. 1, 2006    (JP) ............... 2006-297527

(51) Int. Cl.
*H02N 13/00*    (2006.01)
*H01T 23/00*    (2006.01)

(52) U.S. Cl. .................................. 361/234
(58) Field of Classification Search ............ 361/234
See application file for complete search history.

(56) References Cited

U.S. PATENT DOCUMENTS

| 2002/0139563 | A1* | 10/2002 | Fujii et al. ............ 174/117 A |
| 2003/0183615 | A1* | 10/2003 | Yamaguchi et al. ...... 219/444.1 |
| 2004/0240142 | A1* | 12/2004 | Fujii et al. ............ 361/233 |
| 2005/0152089 | A1* | 7/2005 | Matsuda et al. ............ 361/234 |
| 2006/0012087 | A1 | 1/2006 | Matsuda et al. |
| 2006/0073349 | A1* | 4/2006 | Aihara et al. ............ 428/469 |
| 2006/0169688 | A1* | 8/2006 | Mori et al. ............ 219/444.1 |
| 2007/0217117 | A1* | 9/2007 | Ohta et al. ............ 361/234 |
| 2008/0174930 | A1* | 7/2008 | Hattori et al. ............ 361/234 |

FOREIGN PATENT DOCUMENTS

| JP | 2000049217 A * | 2/2000 |
| JP | 2002-313530 A1 | 10/2002 |
| JP | 2003-179127 | 6/2003 |
| JP | 2005-343733 | 12/2005 |
| JP | 3752376 B2 | 3/2006 |
| KR | 2006-67832 | 6/2006 |

* cited by examiner

*Primary Examiner*—Ronald W Leja
(74) *Attorney, Agent, or Firm*—Burr & Brown

(57) ABSTRACT

An electrostatic chuck includes a base, and includes an electrode embedded in the base in parallel to a substrate mounting surface of the base. A terminal loaded into a terminal hole drilled into a back surface of the base toward the electrode is bonded to the electrode having a protruded portion with a substantially conical trapezoidal shape, which is formed on a flat surface on the terminal side of the electrode toward the terminal hole. In the protruded portion, an angle made by the flat surface on the terminal side of the electrode and an inclined surface of the protruded portion is 40° or less, and a distance from the flat surface of the electrode to a terminal-bonding surface of the protruded portion is 0.01 to 0.8 mm.

6 Claims, 1 Drawing Sheet

ELECTROSTATIC CHUCK AND MANUFACTURING METHOD THEREOF

CROSS-REFERENCE TO RELATED APPLICATION

This application is based upon and claims the benefit of priority from Patent Application No. 2006-297527 filed on Nov. 1, 2006, in the Japanese Patent Office, of which contents are incorporated herein by reference.

BACKGROUND OF THE INVENTION

1. Field of the Invention

The present invention relates to an electrostatic chuck and a manufacturing method of the electrostatic chuck.

2. Description of the Related Art

Heretofore, in the case of manufacturing a semiconductor device, a surface treatment such as deposition and etching has been implemented for a semiconductor wafer. As one of the apparatuses which hold the semiconductor wafer during this surface treatment, there is an electrostatic chuck. This electrostatic chuck has a substrate mounting surface on which a substrate such as the semiconductor wafer is mounted and held, and holds the semiconductor wafer by electrostatic force generated on the substrate mounting surface.

A typical example of the electrostatic chuck includes a base made of ceramics. Moreover, an upper surface of the base becomes the substrate mounting surface on which the substrate such as the wafer is mounted. Furthermore, an electrode for generating the electrostatic force on the substrate mounting surface is embedded in an inside of the base. In addition, a portion from the electrode to the substrate mounting surface in the base becomes a dielectric layer, a portion from the electrode to a lower surface (back surface) of the base becomes a support portion, and the dielectric layer and the support portion are formed integrally across the electrode embedded in the base.

A terminal hole is drilled from the back surface of the base toward the electrode embedded in the base, and a terminal is loaded into this terminal hole, and is brazed to the electrode, whereby the terminal and the electrode are electrically connected to each other.

Such a treatment object holder as described above, in which the electrode is embedded and the electrode and the terminal are electrically connected to each other, is described in Japanese Patent Laid-Open Publication No. 2002-313530.

A thickness of the electrode of the electrostatic chuck is approximately several ten micrometers in general. When the terminal hole is drilled from the back surface of the base toward the electrode in the base, and the terminal is loaded into the terminal hole and bonded to the electrode, it is vital to drill the terminal hole so that the electrode can be exposed to a bottom surface of the terminal hole, and it must be avoided that the terminal hole penetrate the electrode in the thickness direction. Hence, it has been regarded necessary to drill the terminal hole while making a strict control for such drilling.

Moreover, it is necessary that a thickness of the dielectric layer in the base be approximately a few millimeters or less in general to generate the electrostatic force for holding the substrate. Therefore, in such a ceramic base, a portion facing to the terminal hole, of the dielectric layer becomes a portion in which the thickness is the thinnest and strength is the lowest in terms of a structure. when the terminal is loaded into the terminal hole, pressing force is applied to the dielectric layer of a portion in contact with the electrode loaded to the terminal hole. As a result, depending on a pressing force for loading the terminal, there has been an apprehension that a crack may occur in the dielectric layer of the portion to which the pressing force is applied.

The material holder in Japanese Patent Laid-Open Publication No. 2002-313530 described above is one configured to decrease a heating resistance value of a terminal portion of a resistance heating body by adopting a configuration in which the terminal portion is thickened more than a heating portion of the resistance heating body concerned. However, the above-described configuration of the material holder is one to enhance uniform heating performance of the resistance heating body particularly when the electrode is the resistance heating body, and a purpose and usage of the electrode in the above-described configuration differ from those of the electrode configured to generate the electrostatic force of the electrostatic chuck. Therefore, even if the above-described configuration of the material holder is merely used for replacing that of the electrode for generating the electrostatic force of the electrostatic chuck, it has been impossible to sufficiently solve the problems described above.

The present invention is one to advantageously solve the above-described problems. It is an object of the present invention to provide an electrostatic chuck that advantageously suppresses an occurrence of the crack in the dielectric layer in the vicinity of the electrode for generating the electrostatic force, has high reliability, and is easy to manufacture, and to provide a manufacturing method of the electrostatic chuck.

SUMMARY OF THE INVENTION

In order to achieve the above-described object, an electrostatic chuck according to the present invention includes: a base made of substantially disc-like alumina ceramics and having a substrate mounting surface; an electrode embedded in the base in parallel to the substrate mounting surface of the base; and a terminal loaded into a terminal hole drilled toward the electrode from the opposite side surface of the substrate mounting surface of the base, wherein the electrode has approximately constant thickness and has, at a portion thereof going toward the terminal hole, a protruded portion with a substantially conical trapezoidal shape, the protruded portion being made of the same type of material as a material of the electrode, and being bonded to the terminal, and in the protruded portion, an angle made by a flat surface on the terminal side of the electrode, from which the protruded portion is protruded, and an inclined surface of the protruded portion is 40° or less, and a distance from the flat surface on the terminal side of the electrode to a terminal-bonding surface of the protruded portion is 0.01 mm or more to less than 0.8 mm.

Moreover, a manufacturing method of the electrostatic chuck according to the present invention includes the steps of: fabricating an alumina sintered body of a portion of a dielectric layer having a substrate mounting surface, the portion belonging to a base; forming a flat electrode having approximately constant thickness, on a surface of the alumina sintered body; forming a protruded portion made of the same type of material as a material of the electrode on a part of the flat electrode so that a thickness of the protruded portion can be 0.8 mm or less and that an angle made by the flat surface on the terminal side of the electrode and an inclined surface of the protruded portion can be 40° or less; forming a support portion of the base to cover the alumina sintered body and the electrode, and then integrally sintering the support portion and the portion of the dielectric layer; drilling a terminal hole from the opposite side surface of the substrate mounting surface of the base toward the protruded portion, exposing the protruded portion to a bottom surface of the terminal hole, and setting a distance of the protruded portion from the flat surface on the terminal side of the electrode to a bottom surface of the terminal hole at 0.01 mm or more to less than 0.8 mm; and loading the terminal into the terminal hole, and bonding the terminal to the protruded portion by brazing.

In accordance with the electrostatic chuck according to the present invention, it becomes possible to obtain a highly reliable electrostatic chuck that is less likely to be broken even by the pressing force caused when the terminal is bonded to the electrode. Moreover, in accordance with the manufacturing method of the electrostatic chuck according to the present invention, it becomes possible to easily manufacture the highly reliable electrostatic chuck.

BRIEF DESCRIPTION OF THE DRAWINGS

The above and further objects, features and advantages of the invention will more fully appear in the detailed description of embodiments of the invention, when the same is read in conjunction with the drawings, in which.

DETAILED DESCRIPTION OF THE INVENTION

A description will be made below of an embodiment of an electrostatic chuck according to the present invention by using the drawings.

Figure 1:
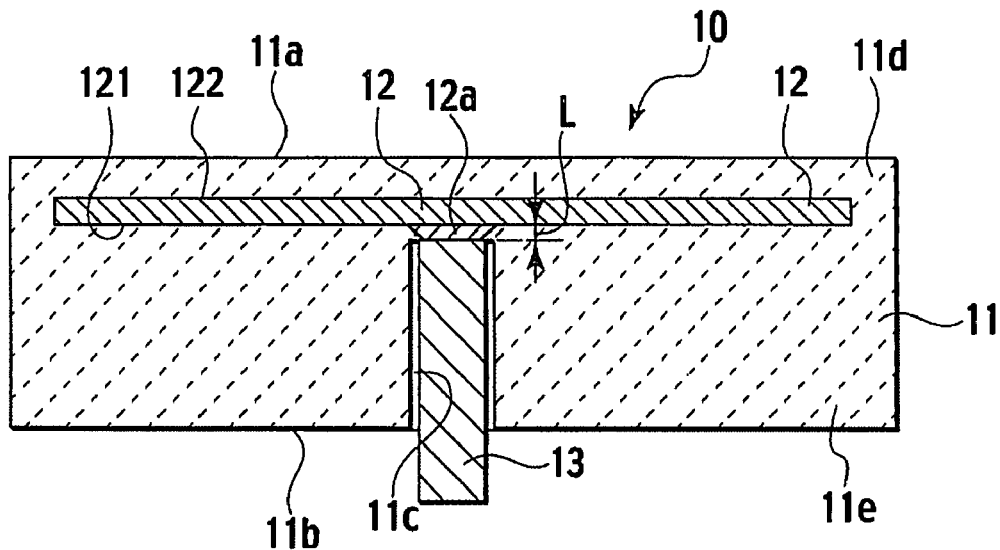
FIG. 1 is a cross-sectional view showing an embodiment of an electrostatic chuck according to the present invention.

FIG. 1 is a cross-sectional view of an electrostatic chuck according to an embodiment of the present invention. Note that, in the electrostatic chuck of this embodiment, which is shown in FIG. 1, dimensions and ratios of the respective members thereof are not always set the same as those of an actual electrostatic chuck in order to facilitate understanding of the invention. Hence, the dimensions and ratios of the respective members of the electrostatic chuck of this embodiment are not limited to those shown in FIG. 1.

The electrostatic chuck 10 shown in FIG. 1 includes a base 11 made of alumina ceramics and having a substantial disc shape. In this base 11, one surface thereof becomes a substrate mounting surface 11a for mounting an object to be held, for example, a semiconductor wafer thereon, and holding the semiconductor wafer by electrostatic force. Other surface of the base becomes a back surface 11b, that is on an opposite side of the substrate mounting surface 11a.

In an inside of the base 11, an electrode 12 having approximately constant thickness and for generating the electrostatic force is embedded in the vicinity of the substrate mounting surface 11a in parallel thereto. As this electrode 12, one is usable, which is fabricated by preparing a paste from a mixture of powder of a conductive material such as tungsten (W) or tungsten carbide (WC) and powder of alumina, and forming such a paste so as to have a predetermined thickness (for example, approximately 10 to 100 μm) by a printing method. An additional amount (ratio) of the alumina powder to the conductive material powder is preferably 5 to 20 vol %.

Toward the electrode 12, a terminal hole 11c is formed from a back surface 11b. Into this terminal hole 11c, a terminal 13 for guiding electric power to the electrode 12 is loaded. In the base 11, a region from the substrate mounting surface 11a to the electrode 12 is a region that becomes a dielectric layer 11d. The above-described electric power is supplied to the dielectric layer 11d, whereby electrostatic suction force is generated on the substrate mounting surface side 11a. A region of the base 11 from the electrode 12 to the back surface 11b is a region that becomes a support portion 11e that supports the above-described dielectric layer.

The electrode 12 has a flat surface 121 on the terminal 13 side and a flat surface 122 on the substrate mounting surface 11a side. In a portion of the electrode 12, which faces to the terminal hole 11c of the base 11, the electrode 12 has a protruded portion 12a of a substantially conical trapezoidal shape, which is formed from the flat surface 121 of the electrode 12 toward the terminal hole 11c. A top of this protruded portion 12a is exposed to a bottom surface of the above-described terminal hole 11c. The top of the protruded portion 12a is bonded, by brazing and like, to an end surface of the terminal 13 loaded into the terminal hole 11c, whereby the electrode 12 is electrically connected to the terminal 13 through the protruded portion 12a.

The electrostatic chuck 10 of this embodiment, which is shown in FIG. 1, has the protruded portion 12a of the substantially conical trapezoidal shape, which is formed from the flat surface 121 of the electrode 12 toward the terminal hole 11c as described above. Accordingly, a thickness of the electrode 12 in the region facing to the terminal is thickened by a height of the protruded portion 12a. The height of the protruded portion 12a, that is, a distance L from a bottom surface of the protruded portion 12a to a top surface is specifically 0.01 mm or more to less than 0.8 mm. Accordingly, strength levels of both of the protruded portion and a periphery thereof are increased. Hence, eliminated is an apprehension that a crack may occur in the dielectric layer 11d in the vicinity of the terminal 13 owing to pressing force applied when the terminal 13 is loaded into the terminal hole 11c.

Moreover, the thickness of the electrode 12 in the region thereof facing to the terminal is thickened by the height of the protruded portion 12a, and accordingly, when the terminal hole 11c is drilled from the back surface 11b toward the electrode 12 at the time of manufacturing the electrostatic chuck, the thickness of the protruded portion 12a provides an tolerance in adjusting a depth of the hole for the purpose of exposing such an electrode material on the bottom portion of the terminal hole 11c. Therefore, a processing control that is strict is relieved, and it becomes easy to manufacture the electrostatic chuck. Moreover, since the tolerance is present by the thickness, the electrode 12 can be prevented from being erroneously penetrated by the terminal hole 11c when the terminal hole is drilled.

From the above, according to this embodiment, it becomes possible to obtain a highly reliable electrostatic chuck.

Figure 2:
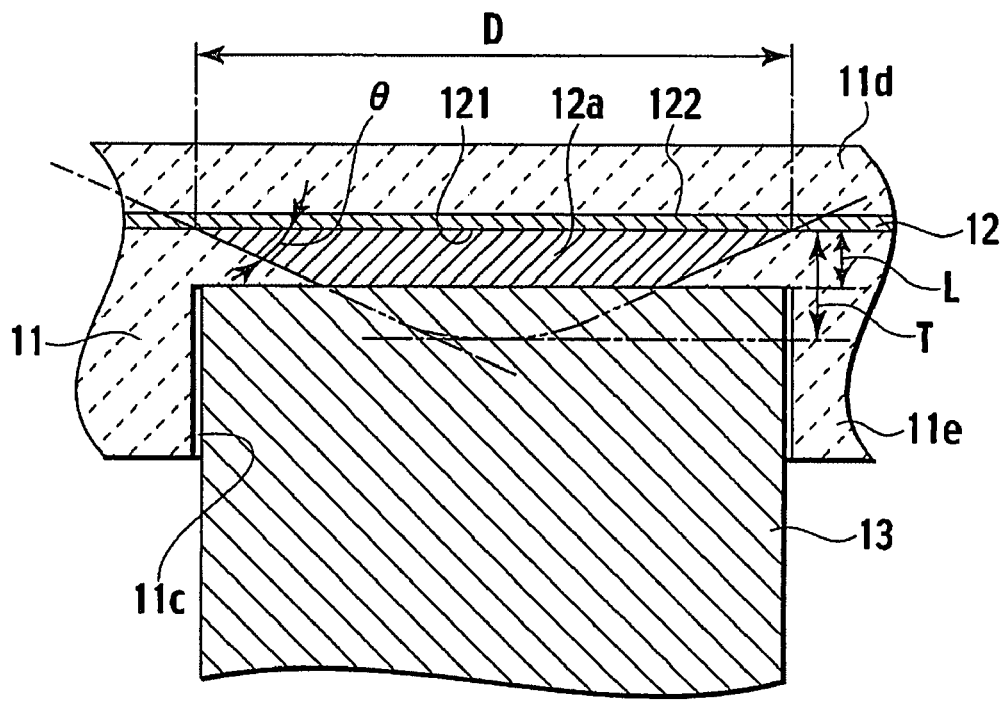
FIG. 2 is an enlarged cross-sectional view of FIG. 1.

FIG. 2 is an enlarged cross-sectional view showing the vicinity of the protruded portion 12a of the electrostatic chuck 10 according to this embodiment shown in FIG. 1. As understood from FIG. 2 of the illustrated embodiment, the protruded portion 12a of the electrode 12 has the substantially conical trapezoidal shape in which a surface facing to the end surface of the terminal 13 becomes the top surface of the conical trapezoidal shape. By the fact that the protruded portion 12a has the substantially conical trapezoidal shape, pressing force per unit area, which is applied to the electrode 12 in the vicinity of the protruded portion when the electrode 12 is bonded to the terminal 13, can be decreased. The structure makes it possible to effectively suppress the crack in the dielectric layer 11d in the vicinity of the terminal 13. Moreover, by the above-described fact that the protruded portion 12a has the substantially conical trapezoidal shape, a crack in the base 11 in the vicinity of the protruded portion 12a, which might result from a difference of a thermal expansion coefficient of the protruded portion 12a containing the conductive material and a thermal expansion coefficient of the base 11 made of alumina, can be suppressed. This is because, as shown in FIG. 2, an angle θ made by the flat surface 121 on the terminal 13 side of the electrode 12 and an inclined surface of the protruded portion 12a is acute, and an intersection therebetween is less likely to become a starting point of the crack resulting from a thermal stress caused by the difference in thermal expansion coefficient.

It is preferable that the angle θ made by the flat surface 121 of the electrode 12 and the inclined surface of the protruded portion 12a be 40° or less. When the angle θ exceeds 40°, there is an apprehension that the crack may occur owing to the above-described difference in thermal expansion coefficient.

Moreover, it is preferable that the height of the protruded portion 12a, that is, the distance L from the flat surface 121 on the terminal 13 side of the electrode 12 to a terminal-bonding surface of the protruded portion 12a be within a range from 0.01 mm or more to less than 0.8 mm. When the distance L is less than 0.01 mm, an effect of providing the protruded portion 12a is poor. Meanwhile, when the distance L is 0.8 mm or more, there is an apprehension that the crack may occur owing to the above-described difference in thermal expansion coefficient. As will be described later, in order to drill the terminal hole and to establish conduction between the terminal and the protruded portion through the terminal hole at the time of manufacturing the electrostatic chuck according to the present invention, it is necessary that the distance L be less than 0.8 mm in consideration for a processing allowance of the top of the protruded portion. In order to ensure an area of the top surface of the protruded portion to some extent for the purpose of surely establishing the conductive connection, it is preferable that the grinding allowance of the top of the protruded portion be 0.1 mm or more, and hence, it is preferable that the distance L be 0.7 mm or less. A more preferable length of the distance L is within 0.02 to 0.4 mm. By the fact that the distance L is within the above-described range, bonding strength between the protruded portion 12a and the terminal 13 is enhanced, and a drilling process of the terminal hole 11c is facilitated.

It is preferable that a diameter D of the bottom surface in the protruded portion 12a with the substantially conical trapezoidal shape be set at 2 to 6 mm. When this diameter D is larger than 6 mm, a region of such a thickened portion is large, and accordingly, there is an apprehension that in-plane uniformity of the electrostatic suction force may be affected. Meanwhile, when the diameter D is smaller than 2 mm, it becomes difficult to set the above-described angle θ and distance L within the above-described ranges.

It is preferable that the protruded portion 12a be made of the same type of material as that of the electrode 12. Specifically, it is preferable that the protruded portion 12a contain the conductive powder and the alumina powder, and that the additional amount (ratio) of the alumina powder to the conductive material powder be 5 to 20 vol %. The protruded portion 12a is made of the same type of material as that of the electrode 12, whereby the difference in thermal expansion coefficient between the protruded portion 12 and the electrode 12 does not occur, and an apprehension about embrittlement thereof caused by the thermal stress is eliminated. Moreover, the protruded portion 12a and the electrode 12 can be bonded sufficiently to each other.

The electrode 12 and the protruded portion 12a contain alumina as well as the high melting-point conductive material such as W and WC. This is for reducing a difference in thermal expansion coefficient between these electrode and protruded portion and the alumina base in the periphery. In such a way, the crack can be effectively suppressed in the vicinity of the dielectric layer at the time of sintering in the manufacture of the electrostatic chuck. A content of alumina concerned is preferably within a range of 5 to 20 vol % with respect to the conductive material such as W and WC. When the content is less than 5 vol %, an effect of containing alumina is poor. Meanwhile, when the content exceeds 20 vol %, there is an apprehension that electrical resistivity of the electrode may be decreased, causing local heat generation.

The protruded portion 12a of the electrode can be formed by forming paste containing the above-described components on the surface of the electrode 12 by means of a printing method. A thickness T of the formed protruded portion, that is, a distance from the surface of the electrode 121 to a vertex of a dome shown by a virtual line in FIG. 2, is preferably 0.8 mm or less. When the thickness T of the protruded portion exceeds 0.8 mm, there is an apprehension that the crack may occur owing to the difference in thermal expansion coefficient between the protruded portion 12a and the base 11. With regard to the protruded portion with the thickness T of 0.8 mm or less, when the terminal hole 11c is drilled in a subsequent step, the vertex of the protruded portion is cut away in order to establish the conduction between the terminal and the protruded portion. In such a way, the distance L from the one flat surface 121 on the terminal 13 side of the electrode 12 to the terminal-bonding surface L is set at 0.01 mm or more to less than 0.8 mm.

As shown in FIG. 2, when the terminal hole 11c is drilled in a subsequent step, the diameter of the bottom surface of the terminal hole 11c is preferably larger than a diameter of the top surface of the protruded portion 12a, which is formed by cutting the vertex of the protruded portion away, and in addition, a diameter of the end surface of the terminal 13 loaded into the terminal hole 11c is preferably larger than the diameter of the top surface of the protruded portion 12a. The diameter of the end surface of the terminal 13 loaded into the terminal hole 11c is larger than the diameter of the top surface of the protruded portion 12a exposed to the bottom surface of the terminal hole 11c. In the bottom surface of the terminal hole 11c, the end surface of the terminal 13 is bonded by brazing to both of the top surface of the protruded portion 12a and the base 11 of the periphery of the top surface. As described above, the end surface of the terminal 13 is bonded not only to the top surface of the protruded portion 12a but also to the base 11 on the periphery of the top surface. Accordingly, in comparison with the case where the end surface is bonded only to the top surface of the protruded portion 12a and with the case where the end surface is directly bonded to the electrode 12 as in the electrostatic chuck conventionally known in public, the dielectric layer 11d can endure the pressing force applied thereto in the vicinity of the terminal hole 11c when the terminal 13 is loaded into the terminal hole 11c, whereby breaking strength of the dielectric layer 11d is significantly increased.

The electrostatic chuck according to this embodiment is configured as described above. In such a way, the distance from the bottom surface of the terminal to the surface of the dielectric layer in the portion where the terminal is bonded to the electrode can be thickened in comparison with the conventional. Accordingly, strength of the bonded portion of the electrode 12 with the terminal 13 is increased, and an electrostatic chuck with a highly reliable terminal structure can be provided.

Next, a description will be made of an example of a manufacturing method of the electrostatic chuck according to the present invention.

First, a portion corresponding to the dielectric layer 11d of the base 11 of the electrostatic chuck 10 is fabricated. For this purpose, a raw material powder of alumina ceramics, which is added and mixed with sintering aids and a binder according to needs, is calcined, and alumina granulated powder is obtained. Thereafter, this alumina granulated powder is molded and sintered, whereby an alumina sintered body is obtained. This alumina sintered body is subjected to a grinding process, and a disc that becomes the dielectric layer 11d is fabricated. In this case, one of a front surface and back surface of the disc is finished into a smooth surface by the grinding process.

Next, the electrode 12 is formed on the smooth surface of the alumina sintered body. For this formation, the alumina powder of 5 to 20 vol % and the binder are mixed with the W powder or the WC powder, thereby preparing the printing paste. Then, the printing paste is coated on the smooth surface of the above-described alumina sintered body by a screen printing method, followed by drying, whereby the electrode 12 is formed.

Next, on a portion predetermined as the position facing to the terminal 13 to be loaded in a subsequent step, the portion being on the surface of the electrode 12, the printing paste having the above-described composition is coated by the contact printing method, followed by drying, whereby a protruded portion which becomes protruded portion 12a of the electrode 12 is formed. The thickness T of the protruded portion is set at 0.8 mm or less. When the thickness T of the protruded portion exceeds 0.8 mm, there is an apprehension that the crack may occur owing to the difference in thermal expansion coefficient between the protruded portion 12a and the base 11. Moreover, the protruded portion 12a is formed so that the angle θ made by the inclined surface of the protruded portion 12a and the flat surface 121 on the terminal 13 side of the electrode 12 can be 40° or less and that the diameter of the bottom surface of the protruded portion 12a can be 2 to 6 mm.

Next, in order to form the support portion, the alumina sintered body in which the above-described electrode 12 and protruded portion 12a are formed is set into a metal mold, and the above-described alumina granulated powder after being calcined is filled thereinto, and press molding is performed with a predetermined pressure. In such a way, a molded body of the base 11 is obtained, in which the alumina sintered body becoming the dielectric layer and an alumina molded body becoming the support portion are integrated together. The molded body thus obtained is sintered, whereby the base 11 is obtained.

Next, the terminal hole 11c is formed from the back surface 11b of the obtained base 11 toward the protruded portion 12a of the electrode 12, and the top surface of the protruded portion 12a is exposed to the bottom surface of the terminal hole 11c. At this time, with regard to a size of the protruded portion 12a, the height from the flat surface 121 on the terminal 13 side of the electrode 12 to the bottom surface of the terminal hole 11c is set at 0.01 mm or more to less than 0.8 mm, preferably, 0.01 mm or more to 0.7 mm or less, more preferably, 0.02 to 0.4 mm. Moreover, the diameter of the terminal hole 11c is set larger than the diameter of the top surface of the protruded portion 12a.

Thereafter, the terminal 13 is loaded into the terminal hole 11c, and the protruded portion 12a and the terminal 13 are bonded to each other by brazing. As the terminal 13, one is applied, in which the diameter of the end surface is larger than the diameter of the top surface of the protruded portion 12a.

Furthermore, the protruded portion according to the invention is not limited to the complete conical trapezoidal shape. The protruded portion may be a form of substantially conical trapezoidal shape, which is formed by cutting off one part of the spherical surface.

EXAMPLES

A variety of the electrostatic chucks were manufactured in accordance with a method to be described below.

In each of the electrostatic chucks, first, the alumina sintered body becoming the dielectric layer was fabricated. For this purpose, alumina powder (grain size: 1 μm) with a purity of 99.9% and MgO powder as the sintering aids were used as the raw material powder of ceramics. Note that a content of MgO in the raw material powder of ceramics was set at 0.04 wt %. Polyvinyl alcohol (PVA) as the binder, water, and a dispersant were added to the raw material powder of ceramics. Then, a resultant was mixed by a trommel for 16 hours, and slurry was prepared. The obtained slurry was sprayed and dried by using a spray dryer, and thereafter, was held at 500° C. for five hours to then remove the binder therefrom, whereby granules with an average diameter of approximately 80 μm were prepared. The alumina granules thus prepared were filled into a metal mold, and were subjected to the press molding with a pressure of 100 kg/cm². Subsequently, a molded body thus obtained was set into a carbon-made sheath, and was fired by using a hot press firing method. The molded body was fired in a nitrogen pressurization atmosphere (150 kPa) under pressurization of 100 kg/cm², was heated up at a rate of 300° C./h, and was held at 1600° C. for two hours, whereby the alumina sintered body of the portion corresponding to the dielectric layer was obtained.

The alumina sintered body thus obtained was subjected to the grinding process, and a disc with a diameter of ø300 mm and a thickness of 6 mm was fabricated. In this case, one surface of the disc was finished up by the grinding process so as to become a smooth surface with a surface roughness Ra of 0.8 μm or less.

Next, the electrode was formed on the alumina sintered body. In order to form the electrode, WC powder (average grain size: 1.5 μm) and alumina powder (average grain size: 1 μm) were mixed together so that the content of alumina could be 20 wt %, and the binder was mixed into an obtained mixture, thereby preparing the printing paste. Then, by the screen printing method, the electrode with a diameter of ø290 mm and a thickness of 10 μm was formed on the smooth surface of the above-described alumina sintered body, followed by drying.

Next, on a center portion on the surface of the electrode after being dried, the paste-like electrode material was printed by the contact printing method, and the protruded portion was formed, followed by drying. In the case of forming the protruded portion, the addition amount of alumina in the electrode material and the shape and size of the protruded portion were variously changed, and plural types of samples of the electrostatic chucks were fabricated. Plural pieces of the electrostatic chucks were fabricated per type.

Next, in order to fabricate each portion becoming the support portion of the base, the alumina sintered body in which the above-described electrode and protruded portion were formed was set into the metal mold, the alumina granulated powder after being calcined, which was for use in fabricating the above-described dielectric layer, was filled thereinto, and the press molding was performed with a pressure of 100 kg/cm².

Subsequently, a molded body thus obtained was set into the carbon-made sheath, and was fired by using the hot press firing method. The molded body was fired in the nitrogen pressurization atmosphere (150 kPa) under the pressurization of 100 kg/cm², was heated up at a rate of 300° C./h, and was held at 1600° C. for two hours. In such a way, a sintered body in which the electrode was embedded was obtained.

A surface on the dielectric layer side of the alumina sintered body was subjected to a plane grinding process by a diamond grindstone, and a thickness of the alumina sintered body, that is, a thickness (thickness of the dielectric layer) from the embedded electrode to the surface was set at 0.3 mm, and a side surface of the sintered body was ground. At this point of time, it was investigated whether or not the crack occurred in the dielectric layer in the vicinity of the protruded portion. An occurrence degree of the cracks in each dielectric layer portion at the time of sintering was obtained as a ratio of the number of pieces of the electrostatic chucks, in which the crack occurred, among the plural pieces of fabricated electrostatic chucks.

Thereafter, when the cracks did not occur, the drilling process was performed from the center portion of the back surface of each alumina sintered body toward the embedded electrode, and the top surface of the protruded portion was exposed to the bottom surface of the terminal hole. Thereafter, an Al brazing material containing slight amounts of Si and Mg and a Mo-made terminal with a diameter of 6 mm were loaded into the terminal hole, and subsequently, heating was performed in an inert gas atmosphere, so that the terminal was bonded by brazing to the surface of the protruded portion of the electrode and the alumina surface of the base on the bottom surface of the terminal hole. In such a way, each electrostatic chuck was completed.

For the electrostatic chucks thus obtained, the terminals were pressed by a compression testing machine, and loads (compression strengths) were measured, at which the vicinities of such terminal-bonded portions including the dielectric layers were broken.

Results of the above are shown in Table 1 to Table 3 together with the addition amounts of alumina in the electrode materials and the shapes of the protruded portions.

TABLE 1

|  | Conventional example | Comparative example 1 | Comparative example 2 | Comparative example 3 | Comparative example 4 | Comparative example 5 | Comparative example 6 | Comparative example 7 | Comparative example 8 |
|---|---|---|---|---|---|---|---|---|---|
| Addition amount of alumina to conductive powder (vol %) | 20 | 20 | 20 | 20 | 20 | 20 | 20 | 20 | 20 |
| Thickness of flat portion of electrode (μm) | 10 | 20 | 10 | 10 | 10 | 10 | 10 | 10 | 10 |
| Diameter D of bottom surface of protruded portion of electrode (mm) | 0 | 0 | 1 to 3 | 1 to 3 | 2 | 3 | 4 | 5 | 2 |
| Thickness T of protruded portion of electrode (mm) | 0 | 0 | 0.2 | 0.5 | 1 | 1 | 1 | 1 | 0.8 |
| Angle θ between planar portion of electrode and inclined surface of protruded portion (°) | 0 | 0 | 90 | 90 | 65 | 45 | 35 | 20 | 55 |
| Ratio of cracks to dielectric layer at time of sintering (%) | 0 | 0 | 90 | 100 | 60 | 40 | 30 | 10 | 50 |
| Distance L between electrode plane and bonded portion (mm) | 0 | 0 | crack | crack | crack | crack | crack | crack | crack |
| Compression strength of bonded portion (N) | 15.7 | 9.8 | crack | crack | crack | crack | crack | crack | crack |

TABLE 2

|  | Example 1 | Example 2 | Example 3 | Example 4 | Example 5 | Comparative example 9 | Example 6 | Example 7 | Example 8 |
|---|---|---|---|---|---|---|---|---|---|
| Addition amount of alumina to conductive powder (vol %) | 20 | 20 | 20 | 20 | 20 | 20 | 20 | 20 | 20 |
| Thickness of flat portion of electrode (μm) | 10 | 10 | 10 | 10 | 10 | 10 | 10 | 10 | 10 |
| Diameter D of bottom surface of protruded portion of electrode (mm) | 3 | 4 | 5 | 5 | 5 | 1 | 3 | 3 | 3 |
| Thickness T of protruded portion of electrode (mm) | 0.8 | 0.8 | 0.8 | 0.8 | 0.8 | 0.6 | 0.6 | 0.6 | 0.4 |
| Angle θ between planar portion of electrode and inclined surface of protruded portion (°) | 40 | 35 | 25 | 25 | 25 | 45 | 30 | 30 | 20 |
| Ratio of cracks to dielectric layer at time of sintering (%) | 0 | 0 | 0 | 0 | 0 | 5 | 0 | 0 | 0 |
| Distance L between electrode plane and bonded portion (mm) | 0.7 | 0.7 | 0.7 | 0.6 | 0.4 | crack | 0.4 | 0.3 | 0.3 |
| Compression strength of bonded portion (N) | 31.9 | 32.3 | 32.3 | 54.9 | 86.2 | crack | 88.2 | 88.2 | 87.2 |

TABLE 3

|  | Example 9 | Example 10 | Example 11 | Example 12 | Example 13 | Comparative example 10 | Example 14 | Example 15 | Example 16 |
|---|---|---|---|---|---|---|---|---|---|
| Addition amount of alumina to conductive powder (vol %) | 20 | 20 | 20 | 20 | 20 | 0 | 5 | 10 | 20 |
| Thickness of flat portion of electrode (μm) | 10 | 10 | 10 | 10 | 10 | 10 | 10 | 10 | 10 |
| Diameter D of bottom surface of protruded portion of electrode (mm) | 3 | 3 | 3 | 3 | 3 | 3 | 3 | 3 | 3 |
| Thickness T of protruded portion of electrode (mm) | 0.4 | 0.4 | 0.4 | 0.4 | 0.4 | 0.4 | 0.4 | 0.4 | 0.4 |
| Angle θ between planar portion of electrode and inclined surface of protruded portion (°) | 20 | 20 | 20 | 20 | 20 | 20 | 20 | 20 | 20 |
| Ratio of cracks to dielectric layer at time of sintering (%) | 0 | 0 | 0 | 0 | 0 | 90 | 0 | 0 | 0 |
| Distance L between electrode plane and bonded portion (mm) | 0.2 | 0.1 | 0.04 | 0.02 | 0.01 | crack | 0.1 | 0.1 | 0.1 |
| Compression strength of bonded portion (N) | 88.2 | 90.2 | 89.2 | 58.8 | 34.3 | crack | 33.3 | 65.7 | 90.2 |

As understood from Table 1 to Table 3, in comparison with comparative examples, in examples in each of which the amount of alumina in the electrode materials and the size of the protruded portion are within the suitable ranges, no cracks occurred, and the bonding strengths were significantly increased.

As opposed to this, in Conventional example and Comparative example 1, since no protruded portions were formed on the electrodes, the terminal holes sometimes penetrated the electrodes when the terminal holes were drilled though no cracks occurred owing to the difference in thermal expansion coefficient. Moreover, in Comparative examples 2 and 3, the large number of cracks occurred since the protruded portions were columnar (in each of which the angle θ was 90°). Furthermore, in Comparative examples 4 to 7, since the thickness T of each protruded portion exceeded 0.8 mm, the cracks occurred owing to the difference in thermal expansion coefficient between each protruded portion 12a and each base 11. Moreover, in Comparative examples 8 and 9, since the angle θ made by the inclined surface of each protruded portion and the plane of each electrode exceeded 40°, the starting points of the cracks caused by the difference in thermal expansion coefficient occurred. Furthermore, in Comparative example 10, since the electrode materials did not contain alumina, the cracks occurred owing to the difference in thermal expansion coefficient.

As understood from comparison with example 3, 4 and example 5, and comparison with example 12 and example 13, the distance L from the flat surface of the electrode to the terminal-bonding surface of the protruded portion was within a range from 0.01 mm or more to 0.7 mm or less, the breaking strength of the bonding surface was significantly enhanced. As understood from comparison with comparable example 10 and example 14 the addition amount of the alumina powder to the conductive material powder be 5 to 20 vol %, the occuration of crack was prevented and breaking strength of the bonding surface was enhanced.

As above, by using the drawings and the embodiment, the description has been made of the electrostatic chuck according to the present invention. However, the electrostatic chuck according to the present invention is not limited to the electrostatic shown in the drawings and the embodiment. For example, though the electrostatic chuck shown in FIG. 1 and FIG. 2 is a unipolar electrostatic chuck in which the electrode is single, the electrostatic chuck according to the present invention may be a bipolar one in which the number of electrodes is two, or may be one in which the number of electrodes is three or more. Moreover, the electrostatic chuck according to the present invention may be a heater-added electrostatic chuck including a heater. The description of the embodiment with reference to the drawings is an illustration of the electrostatic chuck according to the present invention, and it is possible to variously modify the electrostatic chuck according to the present invention within the scope without departing from the spirit of the present invention.

What is claimed is:

1. An electrostatic chuck, comprising:
    a base made of substantially disc-like alumina ceramics and having a substrate mounting surface;
    an electrode embedded in the base in parallel to the substrate mounting surface of the base; and
    a terminal loaded into a terminal hole drilled toward the electrode from the opposite side surface of the substrate mounting surface of the base,
    wherein the electrode has approximately constant thickness and includes, at a portion thereof facing the terminal hole, a protruded portion with a substantially conical trapezoidal shape, the protruded portion being made of the same type of material as the electrode and having a first surface bonded to an end surface of the terminal,
    wherein the diameter of the end surface of the terminal that is bonded to the first surface of the protruded portion is larger than the diameter of the first surface of the protruded portion, and
    wherein in the protruded portion, an angle made by a flat surface on the terminal side of the electrode, from which the protruded portion is protruded, and an inclined surface of the protruded portion is 40° or less, and a distance from the flat surface on the terminal side of the electrode to the first surface of the protruded portion is 0.01 mm to less than 0.8 mm.

2. The electrostatic chuck according to claim 1, wherein said distance is 0.02 to 0.4 mm.

3. The electrostatic chuck according to claim 1, wherein the diameter of a second surface, opposed to said first surface of the protruded portion is 2 to 6 mm.

4. The electrostatic chuck according to claim 1, wherein the electrode contains conductive powder and 5 to 20 vol % of alumina powder.

5. The electrostatic chuck according to claim 1, wherein an outer annular section of said end surface of the terminal is in direct contact with a portion of the base.

6. A manufacturing method of an electrostatic chuck, comprising the steps of:
fabricating an alumina sintered body of a portion of a dielectric layer including a substrate mounting surface, the portion belonging to a base;
forming a flat electrode having approximately constant thickness, on a surface of the alumina sintered body;
forming a protruded portion, having a substantially conical trapezoidal shape, made of the same type of material as the electrode on a part of the flat electrode so that a thickness of the protruded portion is 0.8 mm or less and that an angle made by the flat surface on the terminal side of the electrode and an inclined surface of the protruded portion is 40° or less;
forming a support portion of the base to cover the alumina sintered body and the electrode, and then integrally sintering the support portion and the portion of the dielectric layer;
drilling a terminal hole from the opposite side surface of the substrate mounting surface of the base toward the protruded portion to expose the protruded portion to a bottom surface of the terminal hole, and setting a distance of the protruded portion from the flat surface on the terminal side of the electrode to a bottom surface of the terminal hole at 0.01 mm to less than 0.8 mm;
loading the terminal into the terminal hole, wherein a diameter of an end surface of the terminal that is bonded to the protruded portion is larger than the diameter of a top surface of the protruded portion; and
bonding the terminal to the protruded portion by brazing.

* * * * *